United States Patent [19]

Sato et al.

[11] Patent Number: 5,304,357
[45] Date of Patent: Apr. 19, 1994

[54] APPARATUS FOR ZONE MELTING RECRYSTALLIZATION OF THIN SEMICONDUCTOR FILM

[75] Inventors: Yukito Sato; Mitsugu Irinoda, both of Sendai; Kouichi Ohtaka, Miyagi; Takeshi Hino; Masafumi Kumano, both of Sendai, all of Japan

[73] Assignee: Ricoh Co. Ltd., Tokyo, Japan

[21] Appl. No.: 880,755

[22] Filed: May 8, 1992

[30] Foreign Application Priority Data

May 15, 1991 [JP] Japan .................................. 3-139814

[51] Int. Cl.$^5$ ........................................ H01L 21/268
[52] U.S. Cl. .................................... 422/250; 437/174; 437/247; 437/173; 148/512; 148/525; 148/DIG. 90; 156/620.7; 156/620.72; 118/50.1; 118/620
[58] Field of Search ................... 437/83, 84, 173, 174, 437/247; 148/511, 512, 525, DIG. 71, DIG. 80, DIG. 90, DIG. 93; 156/620.7, 620.72, 620.74; 118/50.1, 620; 422/250, 252

[56] References Cited

U.S. PATENT DOCUMENTS

| 4,177,372 | 12/1979 | Kotera et al. ............... 148/DIG. 90 |
| 4,330,363 | 5/1982 | Biegesen et al. ............... 156/620.72 |
| 4,375,993 | 3/1983 | Mori et al. ................... 148/DIG. 93 |
| 4,589,951 | 5/1986 | Kawamura ..................... 156/620.72 |
| 4,685,976 | 8/1987 | Schachameyer et al. .......... 437/173 |
| 4,915,772 | 4/1990 | Fehlmer et al. ................ 156/620.7 |
| 5,122,223 | 6/1992 | Geis et al. ................... 156/620.72 |

FOREIGN PATENT DOCUMENTS

| 1139453 | 1/1983 | Canada .............................. 437/83 |
| 67132 | 5/1980 | Japan .............................. 437/174 |
| 241909 | 10/1986 | Japan .............................. 437/83 |
| 8703916 | 7/1987 | World Int. Prop. O. . |

Primary Examiner—Robert Kunemund
Assistant Examiner—Ramamohan Rao Paladugu
Attorney, Agent, or Firm—Cooper & Dunham

[57] ABSTRACT

An apparatus for zone melting a thin semiconductor film comprises an first laser for heating the thin semiconductor film, at least one additional laser for heating an insulating substrate, a first temperature detecting device for detecting the temperature of a melted portion of the thin semiconductor film, and a second temperature detecting device for detecting the temperature of a solidified portion of the thin semiconductor film. The apparatus further comprises a first controller for controlling an output of the first laser so as to maintain the temperature of the melted portion in a first predetermined temperature range, and a second controller for controlling an output of the additional laser so as to maintain the temperature of the solidified portion in a second predetermined temperature range.

17 Claims, 13 Drawing Sheets

X-RAY PEAKS OF RECRYSTALLIZED FILM

SURFACE (100) PLANE ORIENTATION

SURFACE (111) PLANE ORIENTATION

APPARATUS FOR ZONE MELTING RECRYSTALLIZATION OF THIN SEMICONDUCTOR FILM

BACKGROUND OF THE INVENTION

Field of the Invention

The present invention relates to a method and an apparatus for producing a thin film semiconductor element.

Description of the Related Art

There are numerous proposals for method for forming a single crystal silicon thin film on an insulating substrate, which is so called as SOI (silicon on insulator) formation method. In most of the proposals, a single crystal silicon layer is obtained by cooling, solidification, and recrystallization after forming an amorphous or a polycrystalline silicon thin film on an insulating substrate and then melting it by various heat sources. The heat sources are laser beam, electron beam, various lamp lights, carbon heater of wire, and so on. If a seed crystal is used for melt recrystallization, an orientation plane of seed crystal dominates determination of crystal orientation plane of single crystal silicon obtained by the SOI formation method using the conventional melt recrystallization, which is a crystal plane of silicon appearing on a substrate surface. If the insulating substrate is a silicon wafer with a silicon oxide layer thereon or with other insulating layer formed by one of various film formation methods, a portion of wafer may be used as a seed crystal by making a pit through the insulating layer on the wafer before forming the amorphous or the polycrystalline silicon layer thereon. The amorphous or the polycrystalline silicon is coated over the pit, and the melt recrystallization starts from above the pit to use the portion of wafer as the seed crystal. However, if the insulating substrate is an amorphous substrate such as silica glass, the above method cannot be used for controlling the orientation plane of recrystallized layer. It is known that a single crystal silicon thin film may be obtained with a (100) orientation by the following method: A polycrystalline silicon layer is formed on a silica glass substrate, a silicon oxide layer is formed as a surface protection layer, the polycrystalline silicon layer sandwiched between the silica glass substrate and the silicon oxide layer is melted in a belt zone with an externally supplied heat, and the melted polycrystalline silicon layer is recrystallized. This method is called as zone melting recrystallization (ZMR) method and known as SOI formation method without use of seed crystal. Such a method is also proposed that there are portions with a higher density of nucleation formed on an amorphous substrate and that a single crystal silicon is selectively grown on the substrate using the difference of nucleation density thereon.

When the seed crystal is used in these SOI formation methods, the crystal orientation plane of single crystal silicon formed on the insulating substrate is determined by the crystal plane of seed crystal. Further, it is the present status of the above ZMR method that the crystal orientation planes except (100) plane cannot be stably obtained. Then, when a semiconductor device is formed using such thin film semiconductor element, properties of device are determined by the crystal orientation plane of used thin film semiconductor element. It has been, therefore, extremely difficult to select a crystal orientation plane suitable for a semiconductor device, and further to obtain an SOI film having different orientations on a single substrate to form a high performance semiconductor device.

The single crystal silicon thin film obtained by the SOI formation method using the conventional melt recrystallization exists continuously all over the substrate, or in a relatively broad area, limiting applications thereof as a thin film semiconductor element. One of limited applications is use in a drive section of device as an active layer of TFT.

Still less is it easy to produce a thin film semiconductor element having a polycrystalline or an amorphous silicon layer together with the single crystalline silicon on a single substrate.

For example, if a sensor portion is formed using an amorphous silicon on a substrate, a single crystal silicon thin film is removed by etching in photolithography from an area necessary for the sensor, the remaining single crystal silicon thin film part is masked, and the amorphous silicon is deposited thereon by a method such as the CVD. A new process is required in such case for forming the amorphous silicon in addition to the process for forming the single crystal thin film.

SUMMARY OF THE INVENTION

It is, therefore, an object of the present invention to provide a method and an apparatus for producing a thin film semiconductor element while controlling recrystallization of semiconductor single crystal layer in the element to obtain a desired orientation of single crystal.

The object of the present invention can be achieved by a method for producing a thin film semiconductor element by heating to recrystallize a composite of insulating substrate and semiconductor layer thereon, comprising a first heating step for emitting a first laser beam, which the semiconductor layer can absorb, to heat the semiconductor layer; a second heating step for emitting a second laser beam, which the insulating substrate can absorb, to heat the substrate; and a temperature controlling step for controlling the first and second heating steps such that a predetermined temperature profile is formed in the composite to fuse and then recrystallize the semiconductor layer so as to obtain a semiconductor single crystal layer therein.

The object of the present invention can also be achieved by an apparatus comprising means for executing the above steps.

The present invention provides a new method for producing an SOI by the zone melting recrystallization method.

The present invention provides a thin film semiconductor element of new type applicable for multiple purposes, in which a semiconductor layer includes regions of different crystalline condition and/or regions of different crystal orientation plane.

The present invention may provide a thin film semiconductor element in which a semiconductor layer is comprised of single crystal of regions of crystal orientation plane (100) and plane (111).

The present invention may provide a thin film semiconductor element in which a semiconductor layer of single crystal is formed in a line shape or in an island shape.

The present invention may provide a thin film semiconductor element in which a semiconductor layer is comprised of single crystal region and polycrystalline region.

The present invention may provide a thin film semiconductor element in which a semiconductor layer is comprised of single crystal region and amorphous region. Specifically, a hydrogen content of amorphous region is preferably not more than 1 atom %.

The present invention may also provide a thin film semiconductor element in which a single crystal region is comprised of (100) orientation region, of (111) orientation region, or of (100) orientation region and (111) orientation region.

The present invention is detailed in the following about a semiconductor thin film layer of silicon. However, the present invention is not limited to silicon, but may be applied to any material having a crystal structure of diamond or of zinc blend of single or compound semiconductor selected from Groups IV, III-V and II-VI in Periodic Table. More specifically, Si may be replaced by either of Ge, SiC, BN, BP, BAs, AlP, AlSb, GaP, GaAs, GaSb, InP, InAs, InSb, ZnS, ZnSe, ZnTe, CdS, CdSe. CdTe, CdHg, and so on.

The method for producing the thin film semiconductor element according to the present invention is featured by simultaneous irradiation of laser beams absorbed by silicon and by the insulating substrate to melt them for recrystallization when the single crystal silicon thin film is formed on the insulating substrate by the zone melting recrystallization. The method is also featured by controlling the crystal orientation of single crystal silicon into (100) plane or into (111) plane by control of temperature profile in melt recrystallization region of silicon layer with a change of irradiation conditions such as outputs of the two laser beams, beam shape, irradiation position, or the like when the two laser beams are irradiated for melt recrystallization of silicon layer.

The following is an explanation on the formation of single crystal silicon by the melt recrystallization of amorphous or polycrystalline silicon formed on the insulating substrate. An amorphous silicon or a polycrystalline silicon having a melting point of 1412° C., and formed on the insulating substrate is heated to melt by one of various heat sources, the heating portion is relatively scanned on the silicon layer, and the melted silicon is solidified by cooling with movement of the heat source, to be recrystallized. If a temperature distribution of the portion melted by the heating has a peak at its center and bases at its periphery as shown in FIG. 1, the recrystallization of melted silicon simultaneously starts from the periphery of the melted portion so that the resultant recrystallized silicon is polycrystalline. It is known that a temperature profile should be lowered at the center in the melted region as compared to the periphery in order to avoid the recrystallization of polycrystalline. The temperature profile in the specification represents a change in temperature in the silicon melting recrystallization process, i.e., a series of phenomena of heating, melting, cooling, and solidifying. Specifically, it is obtained by measuring a temperature or an alternative physical property representing the temperature in one or plural states of the phenomena. Arranging the temperature profile as shown in FIG. 2, the recrystallization always starts from the center, so that a single crystal may be obtained in the recrystallized silicon. A laser beam is mainly used as the heating source, which has a scan speed of approximately several tens cm/sec.

A zone melting recrystallization (ZMR) is another method for forming a single crystal silicon thin film on the insulating substrate by the melting recrystallization.

The formation of single crystal silicon by this method is as follows.

As shown in FIGS. 3a and 3b, a silicon layer to be melted and recrystallized is heated to melt in a belt zone, the silicon layer except region 8 of melted belt zone is heated up to a temperature near the melting point of silicon, and the melted region is moved to recrystallize the silicon to obtain a single silicon. It is said that there is a supercooling region, which maintains a state of liquid below the melting point 1412° C. of silicon as shown in FIG. 4, in a solid-liquid interface in solidification of melted silicon, and that the solid-liquid interface of recrystallizing silicon is formed of congregations of facet, which is a small crystal plane, of (111) plane, which is the slowest in growth of crystal planes of silicon in the supercooling region. The formation of single crystal silicon is achieved by moving the supercooling region with movement of melted region 8 so as to cause the continuous growth of facet composed of the (111) plane of silicon in the supercooling region. A method for forming the belt melted region is heating by a line carbon heater disposed adjacent to the substrate, or an RF induction heating. A speed of movement of belt melted region is about several mm/sec. It is a feature of this method that a thermal equilibrium is achieved in the solid-liquid interface upon the recrystallization. In case that the recrystallized single crystal silicon thin film formed by such zone melting recrystallization is on the insulating substrate of silica glass or $SiO_2$ layer, and that a surface protection layer upon the recrystallization is $SiO_2$ formed by the thermal CVD thereon, the crystal orientation plane of recrystallized film is the (100) plane without use of seed crystal.

Inventors noted this zone melting recrystallization, and invented a zone melting recrystallization using heating means with a function different from that of conventional heatings. Using the new method, the orientation plane of resultant recrystallized single crystal silicon film may be controlled either into the (100) plane or into the (111) plane, which has been difficult in the conventional zone melting recrystallization.

There are below described technical bases of the present invention.

Two laser beams are used as heating source in the present invention, one of which is a first laser beam absorbed by the silicon, and the other of which is a second laser beam absorbed by the insulating substrate. This is based on the fact that these laser beams greatly suit as heat source for formation of single crystal silicon on the insulating substrate by the zone melting recrystallization.

It is first explained that the laser heating is advantageous as compared to other heatings in the zone melting recrystallization. FIG. 20 shows heating of line heater, which is normally used as heat source in the conventional zone melting recrystallization. The line heater of heat source mainly provides the radiant heating in the temperature range near the melting point of silicon, and the following relation is held for a quantity of heat received from the heat source at an arbitrary point on the substrate.

$$Q_{1 \to 2} \propto \int_{A_1} \int_{A_2} \cos\phi_1 \cdot \cos\phi_2 \cdot \frac{1}{L^2} dA_1 dA_2 \quad (1)$$

where $Q_{1\rightarrow 2}$ is a quantity of heat received from the heat source at an arbitrary point on the substrate;

L a distance between the heat source and the substrate having the semiconductor layer;

$A_1$ an area of heat source of line heater;

$A_2$ an area of semiconductor layer to be heated;

$dA_1$ a differential area at $A_1$;

$dA_2$ a differential area at $A_2$;

$\phi_1$ an angle viewing $dA_2$ from $dA_1$; and $\phi_2$ an angle viewing $dA_1$ from $dA_2$.

As seen in the above relation, the quantity of heat is influenced by a square of distance L between the heat source and the substrate. The zone melting recrystallization by the radiant heating requires precise control of distance between the heat source and the substrate to obtain a temperature profile for stable recrystallization. This is essential for the radiant heating not also in the line heater, but also in other heat sources. In contrast, in case that the heat source is a laser beam, heat generation is caused by absorption of laser beam, in which a temperature profile on the substrate is not influenced by a distance between the substrate and the laser beam source. Also considering the excellent parallelism of laser beam, the laser beam may be guided from the light source at an arbitrary position to the substrate.

A cooling speed needs to be set slower, because the supercooling region must be formed in the solid-liquid interface of recrystallization in the zone melting recrystallization using the conventional heating methods. Consequently, the entire substrate must be heated to near the melting point of silicon in order to keep the heat gradient smaller in the solid-liquid interface. This sometimes causes a heat deformation of substrate due to the high temperature heating for a long time after the zone melting recrystallization. Since the heating apparatus is large in scale in the conventional method, dimensions of substrate are occasionally restricted from restrictions of apparatus.

On the contrary, if the heat source is of laser beam, the laser-irradiated region may be kept at a fully high temperature against thermal escape to the surroundings, because the laser beam has a sufficiently high energy density as compared to the other heating methods. It is then unnecessary to heat the entire substrate to near the melting point of silicon, avoiding the thermal deformation of substrate due to the high temperature heating in the conventional zone melting recrystallization and setting free from the restrictions of the apparatus for heating the substrate.

In addition to the above features of heat source of laser beam, the laser beam may be freely changed in size by a combination of optical members such as lens, mirror, and so on, and the process of zone melting recrystallization may be selectively effected thereby on a part in the substrate, which was difficult in the conventional heating methods, by guiding the laser beam to an arbitrary position thereon.

Further, since the absorption of laser beam by a material is within about several tens $\mu$m from the surface of material, heating is effected only on the surface of substrate by the heating source of laser. Therefore, if a proper heat-resisting layer is formed on the surface of substrate, it is possible to use as a support substrate a substrate having a lower melting point or softening point than the melting point of silicon, which was not possible in the conventional zone melting recrystallization.

The present invention has new features by use of the above-mentioned two laser beams in addition to the advantages of laser beam as heat source in the zone melting recrystallization.

FIG. 8 shows the zone melting recrystallization according to the present invention. A first laser beam 4 and a second laser beam 5 are simultaneously irradiated on a silicon layer or semiconductor layer 2 formed on an insulating substrate 1. The first laser beam 4 is absorbed by the silicon layer 2 to produce heat therein. The second laser beam 5 is absorbed in the substrate 1 to produce heat therein. In other words, the silicon layer 2 is subject to preliminary heating by the second laser beam 5 and then to heating by the first laser beam 4. FIG. 9 shows a temperature profile in the region heated by the two laser beams. As shown in FIG. 9, a beam diameter $a_2$ of second laser beam is set larger and a beam diameter $a_1$ of first laser beam smaller, so that a melt region of silicon may be controlled to form by optimization of output of two laser beams.

Such temperature profile is substantially identical in the region heated by the laser beam to that in the zone melting recrystallization as shown in FIG. 3. A recrystallized single crystal silicon may be obtained in the aforementioned zone melting recrystallization by relatively scanning the beam relative to the substrate while keeping such temperature profile.

Further, this technique is featured by capability of heat generation at different positions such that heat generation occurs in the silicon thin film layer by the irradiation of first laser beam and another heat generation in the insulating substrate by the irradiation of second laser beam.

Inventors noted the features of two wavelength laser zone melting recrystallization, and studied in details the recrystallization of silicon thin film on the insulating substrate thereby. Inventors have found that a single crystal silicon of (100) plane orientation and (111) plane orientation may be obtained in the zone melting recrystallization without use of seed crystal on an amorphous insulating substrate using the technique. The details thereof are below explained.

The following has already been explained to be necessary for obtaining a single crystal silicon on an amorphous substrate in the zone melting recrystallization: A supercooling silicon melt exists in the solid-liquid interface of recrystallizing silicon where the silicon melt heated to melt on the substrate is cooled, solidified, and recrystallized; and the solid-liquid interface in the supercooling melt is a facet composed of the (111) plane of silicon. FIG. 10 shows X-ray peaks of recrystallized film presenting a change in crystal orientation of recrystallized silicon while the recrystallization temperature of silicon melt is changed after forming a polycrystalline silicon on the insulating substrate and heating to melt it. As seen in FIG. 10, the temperature difference of silicon melt causes a difference of crystal orientation plane of recrystallized silicon, obtaining either the (100) plane or the (111) plane. Thus the temperature upon melting of silicon is a factor to determine the orientation of recrystallized silicon. FIGS. 11a and 11b show facet structures in the solid-liquid interface of recrystallized silicon, in which the single crystal silicon thin film after melt recrystallization is obtained to have the crystal orientation of (100) plane and (111) plane, respectively. If the crystal orientation plane is either the (100) plane or the (111) plane as set in FIGS. 11a and 11b, the facet in the solid-liquid interface must be inclined at an angle different from each other from the crystallographic restriction. In detail, the angle of facet is 55° for (100)plane orientation as shown in FIG. 11a, and 70° for (111)plane orientation as shown in FIG. 11b. If the angle of facet is different from these degrees, there is no stable (100) plane or (111) plane obtained. A thermal simulation showed necessity of temperature gradient in depth to obtain such inclined facet, and domination of heat generated in the substrate to obtain the desired temperature gradient.

In the present invention based on the above-described background, in the zone melting recrystallization of silicon on the insulating substrate, the first laser beam absorbed by the silicon and the second laser beam absorbed by the insulating substrate are simultaneously irradiated to generate heat at positions different in depth in order to control the crystal orientation of recrystallized film into the (100) plane or into the (111) plane, controlling the temperature profile in the zone melting recrystallization.

Below explained with reference to FIG. 13 is structural elements of composite for thin film semiconductor element according to the present invention.

The support substrate 1 is formed of insulating material. A single material therefor is an insulating material with heat resistance such as silica glass, ceramics, or the like. A substrate with an insulating layer formed on a metal or a semiconductor may be used as the support substrate of present invention. Specifically, such substrate is one having the insulating layer of $SiO_2$, $Si_3N_4$, or the like on a silicon wafer. The substrate could also be one with the insulating layer of $SiO_2$, $Si_3N_4$, or the like on a metal such as Fe, Al, and Cu. A material with a lower melting point than silicon may be used as the support substrate by forming a heat resisting layer. A material for heat resisting layer may be selected from insulating materials such as $SiO_2$, $Al_2O_3$, $TiO_2$, $ZrO_2$, $Si_3N_4$, and BN, and from conductive materials such as TiC, SiC, or the like. If the heat resisting layer is made of conductive material, the above insulating material should be used thereon. A combination of plural heat resisting materials may be used if necessary. The composite may be formed using these materials by the film formation method such as plasma CVD, thermal CVD, optical CVD, LP-CVD, MO-CVD, sputtering, vacuum deposition, ion beam cluster, or the like, and by the technique of material modification such as ion implantation. If the insulating material is formed on the semiconductor or the metal to provide the support substrate, or if the heat resisting layer or the insulating layer is formed on the material with low melting point to provide the support substrate, the thickness of insulating layer or heat resisting layer should be determined taking the absorption of second laser beam thereby into consideration. For example, in case that the second laser beam is the carbon dioxide gas laser, and that $SiO_2$ is formed as the insulating layer or as the heat resisting layer, the film thickness is about 50 μm. If the insulating material such as silica glass is used as a single support substrate, the thickness thereof is fully greater than the absorption thickness of laser to maintain the mechanical strength. The thickness is normally 0.3 mm-5.0 mm, and preferably 0.5 mm-2.0 mm.

The silicon layer 2 is made of polycrystalline silicon or of amorphous silicon, which is recrystallized into single crystal on the support substrate 1 by the two wavelength laser zone melting recrystallization. The silicon layer 2 may be formed using any of various film formation methods such as plasma CVD, thermal CVD, optical CVD, LP-CVD, MO-CVD, sputtering, vacuum deposition, ion beam cluster, and by the technique for material modification such as ion implantation. The silicon layer 2 may be reformed in an arbitrary shape using the technique of ordinary photolithography if it is judged necessary in the process of zone melting recrystallization. Specifically, the silicon layer 2 may be shaped in stripe, in islands, in connected islands as shown in FIGS. 5, 6, and 7. The purpose of such shaping is to limit movement of silicon melt on the support substrate 1 to increase the stability of faceted growth, which has been often used in conventional zone melting recrystallization. The shaping of silicon layer 2 contributes to improvement of uniformity in film thickness of single crystal silicon layer obtained by the recrystallization, but does not influence determination of orientation. The thickness of silicon layer 2 is between 0.1 μm and 5.0 μm for recrystallization, and preferably between 0.3 μm and 1.0 μm.

The surface protection layer 3 is indispensable for formation of single crystal silicon layer by the zone melting recrystallization method. It is formed in order to prevent the melt silicon from being evaporated or from being rounding or beading-up due to the surface tension in the zone melting recrystallization process. The surface protection layer 3 is made of insulating material. Preferable materials are $SiO_2$, SiO, $Si_3N_4$, and SiN. They may be used alone or in combination thereof to form the silicon layer 2. The surface protection layer 3 may be formed using any of various film formation methods such as plasma CVD, thermal CVD, optical CVD, LP-CVD, MO-CVD, sputtering, vacuum deposition, and ion beam cluster, and by the technique for material modification such as ion implantation. The optimum film thickness of protection layer is between 0.5 μm and 5.0 μm, and preferably between 1.0 μm and 2.0 μm. The surface protection layer 3 may be removed in case in a process for forming a semiconductor device using the thin film semiconductor element thus obtained by the present invention.

The first laser beam in the two wavelength laser zone melting recrystallization method of the present invention may be selected from laser beams with wavelength within the absorption band of silicon, which is below about 1.2 μm. Specifically, various lasers having low wavelength may be used such as excimer laser, He-Cd laser, Ar laser, He-Ne laser, ruby laser, alexandrite laser, YAG laser, and semiconductor lasers. It is desired for the first laser to provide a relatively great output power to be obtained and to be capable of continuous oscillation from the view point that it is used as the heat source for forming the temperature profile necessary for zone melting recrystallization. The first laser may be preferably selected from Ar laser, YAG laser and high power semiconductor lasers. These lasers could be used with a laser beam expander on the way of beam to expand the irradiation region. Further, a plurality of laser beams may be coupled. A uniform line beam is preferable for irradiation on the silicon layer in the zone melting recrystallization. The beam may be shaped linear and uniform, using various optical devices. A combination of plural beams may form such uniform and linear beam. A pseudo-linear beam may be formed by high speed scanning thereof.

The second laser beam used for preheating of substrate may be selected from laser beams which may be absorbed by the insulating materials. Laser beams of infrared region are preferable for the second laser beam because they may be absorbed by the insulating materials. Specifically, the carbon dioxide gas laser or the carbon monoxide gas laser may be used. It is not always necessary that the second laser beam is of line shape. The second beam should have a shape sufficient to control the temperature profile of recrystallization of silicon heated to melt by the first laser when superimposed on the first laser beam. If the first laser beam of line has a length of $L_1$ as shown in FIG. 14, the second laser should have a length of $L_2$ in that direction, which satisfies the condition of $L_2 > L_1$, preferably of $L_2 > 1.2 L_1$. The laser beam is normally obtained in a round shape. It may be used by changing the shape by various means into elongate ellipse or into substantial rectangle.

The second laser beam is used as the heat source of zone melting recrystallization of silicon layer as well as the first laser beam. The first laser beam is principally used to heat and melt the silicon, and the second laser beam is used to control the processes of cooling, solidification, and recrystallization of melted silicon. The area heated by the second laser beam should show a uniform temperature profile accordingly. Then the second laser beam is required to have a uniform power density in a broader area as compared to the first laser beam. The beam output may be made even using the various optical devices such as kaleidoscope, segment mirror, or the like. The second laser beam may be formed by combination of plural laser beams similarly as the first laser beam. The temperature profile of heating portion may be made even by scanning the beam. A laser beam of pulse oscillation type may be used in addition to that of continuous oscillation type.

The second laser beam is positioned to enclose the first laser beam upon irradiation on the substrate. Even if the beam intensity of second laser beam is uniform, the temperature gradient is caused on the periphery of second laser beam due to the great temperature difference between inside and outside the second laser beam. In such case, the beam profile of the second laser beam may be emphasized on the periphery thereof to make the temperature even.

The first and the second laser beams used in the two wavelength laser zone melting recrystallization method should be modulated in intensity in correspondence with a change of temperature at the position of irradiation in addition to the above features.

The present invention may provide a recrystallized film of single crystal silicon with different orientation planes of (100) plane and (111) plane under control. There has been above explained about the mechanism to obtain the recrystallized film of different orientation planes in the two wavelength laser zone melting recrystallization method. Feedback control is necessary for output of irradiation laser beam to obtain the temperature profile of melting recrystallization with temperature gradient to determine the temperature range of melted silicon or the inclination of facet of solid-liquid interface. It is because the quantity of heat upon absorption of first and second laser beams is changed depending on various factors such as film thickness of absorbing layer, reflectance of surface, and the like. Therefore, the feedback control of light intensity is necessary to stably control the temperature profile through the zone melting recrystallization process. The control of temperature profile is necessary to control the orientation as beforereasoned.

FIG. 15 shows an example of feedback control of laser beam intensity. Temperature information at an irradiation position is taken by a sensor 15 as a feedback signal through the controller 14 into a laser power source circuit 13 to control the output from a laser oscillator 12. FIG. 16 shows another example of feedback control. There is provided a mechanism 16 for continuously changing the light intensity by an external signal between a laser oscillator 12 and a sample 11, and a controller 14 for controlling the mechanism in response to a temperature change detected by a sensor 15. A combination of two polarization plates may be used as the mechanism for continuously changing the intensity of light.

There is no limitations on the irradiation method of first and second laser beams with the feedback control mechanism of light output as far as the temperature profile as shown in FIG. 9 is obtained by the irradiation of two laser beams on the substrate and as the zone melting recrystallization is effected. Further, it is not always necessary that the temperature profile is symmetrical with respect to the scan direction of beam as shown in FIG. 9, because the important point is a process from melt to solidification for the zone melting recrystallization.

Further objects and advantages of the present invention will be apparent from the following description of the preferred embodiments of the invention as illustrated in the accompanying drawings.

BRIEF DESCRIPTION OF THE DRAWINGS

FIG. 21b is a schematic drawing of optical sensor array in Example 4 obtained from the element of FIG. 21a.

DESCRIPTION OF THE PREFERRED EMBODIMENTS

Example 1

TFT with single crystal layer including single-crystal regions of different crystal orientation plane In Example 1, an Ar laser beam was used as the first laser beam, and a carbon dioxide laser beam as the second laser beam.

Figure 17:
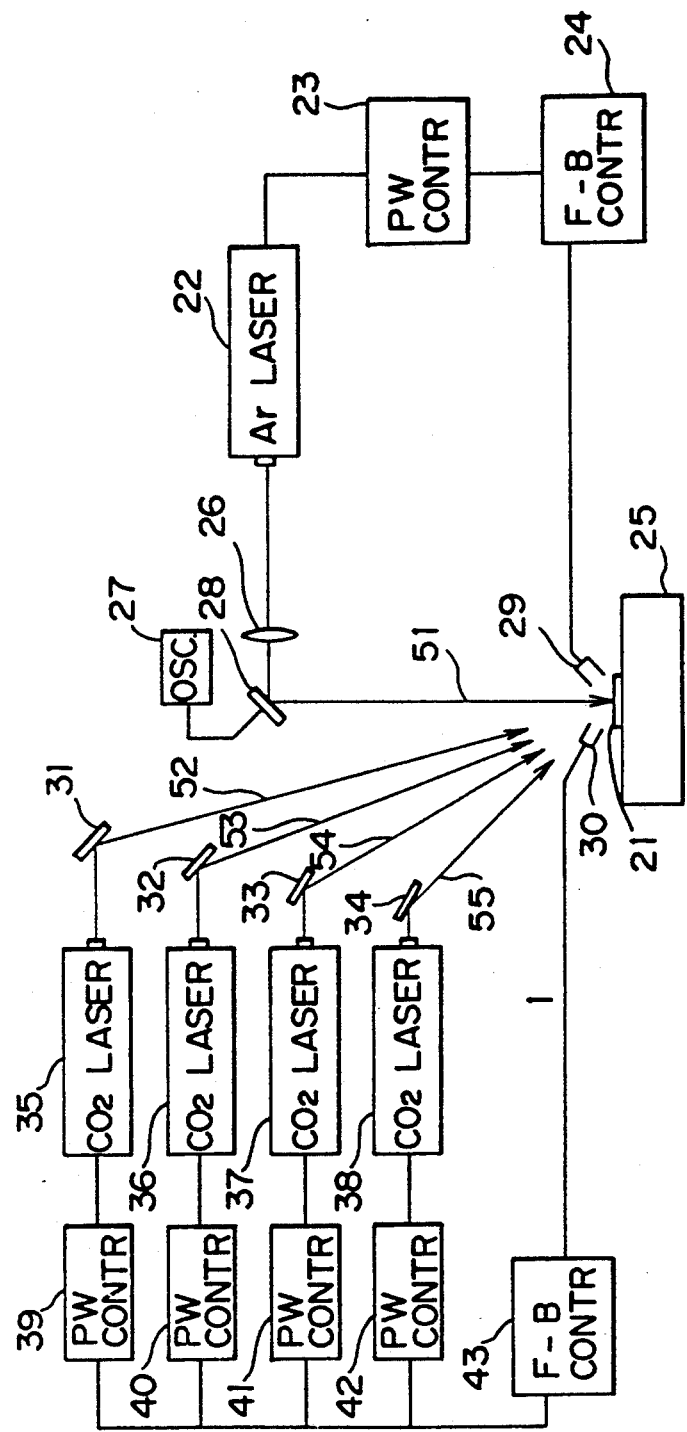
FIG. 17 is a diagram to show a laser irradiation system according to the present invention.

As shown in FIG. 17, an Ar laser beam 51 was emitted from an Ar laser oscillator 22 with multiline oscillation of beam diameter of 1.9 mm. A convex lens 26 was located to focus a line beam on a sample 21. A mirror 28 with a vibration mechanism 27 was provided between the convex lens 26 and the sample 21. A beam spot was vibrated in a direction perpendicular to a scan direction of laser beam on the sample 21 to form a line temperature profile on the sample 21.

Carbon dioxide lasers 52, 53, 54, 55 were guided from carbon dioxide laser oscillators 35, 36, 37, 38 through respective mirrors 31, 32, 33, 34 onto the sample 21. A beam diameter of the carbon dioxide laser beams was 5 mm.

A laser power source 23 was controlled by a temperature detection unit 29 comprising a radiation thermometer and a feedback control unit 24. The Ar laser beam 51 was controlled by controlling an output of laser power source 23 to maintain the temperature at the metering portion constant through the beam scan. Also, the carbon dioxide gas laser beams 52, 53, 54, 55 were controlled by controlling respective laser power sources 39, 40, 41, 42 through a temperature detection unit 30 comprising a radiation thermometer, and through a feedback control unit 43.

The substrate for recrystallized film was prepared as follows.

Figure 1:
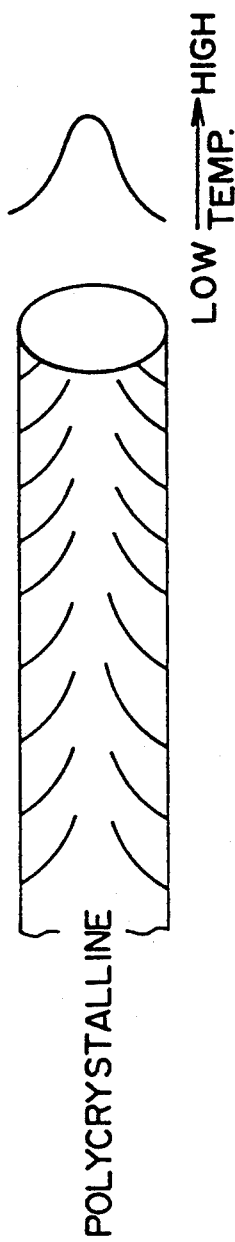
FIG. 1 is a schematic drawing to show an incidence of polycrystallization with a temperature distribution upon melt recrystallization.
Figure 2:
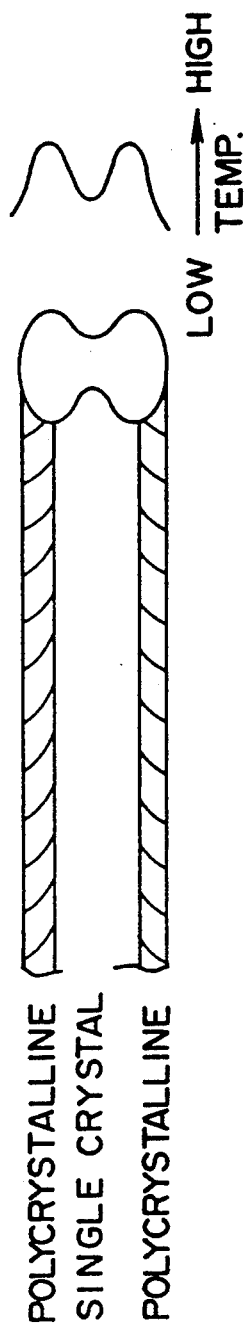
FIG. 2 is a schematic drawing to show an incidence of single crystallization with a temperature distribution upon melt recrystallization.
Figure 3A:
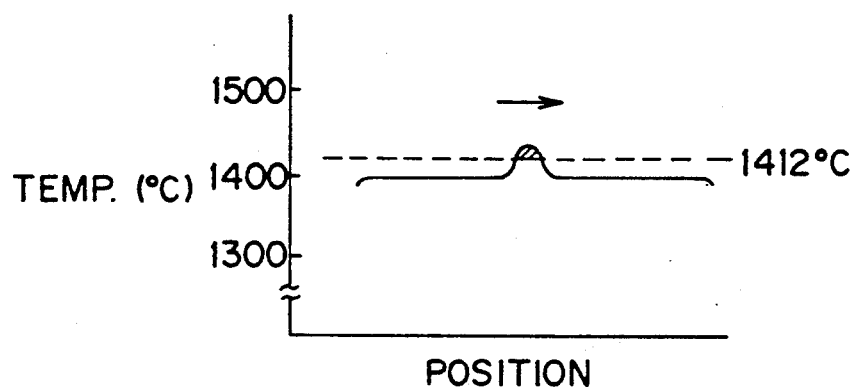
FIG. 3a shows a preferable temperature distribution of silicon thin film in a direction of recrystallization as shown by an arrow, in which the melt recrystallization is occurring in the portion having a temperature above the melting point 1412° C. of silicon.
Figure 3B:
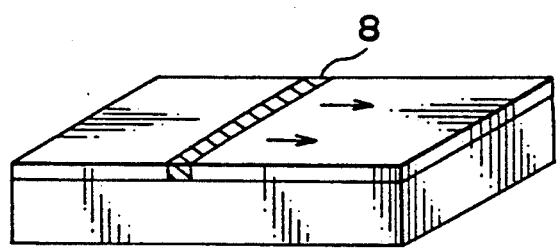
FIG. 3b is a schematic drawing of thin film semiconductor element comprised of insulating substrate with a silicon thin film layer thereon.
Figure 4:
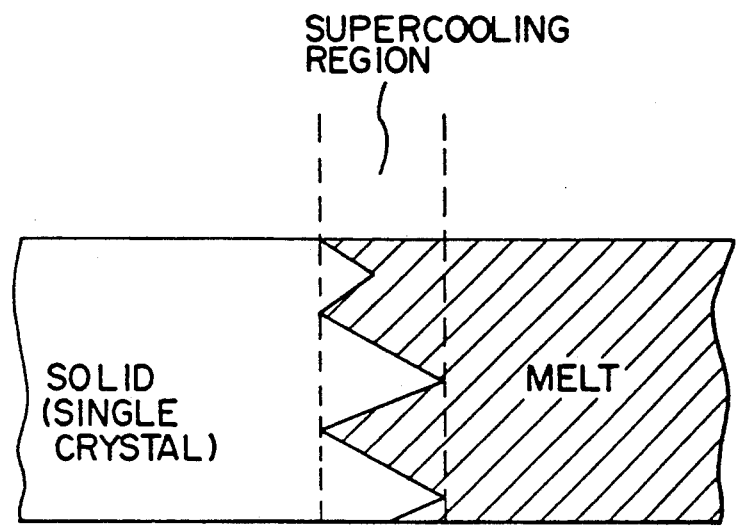
FIG. 4 is a diagram of state near a solid-liquid interface of melted silicon.
Figure 5:
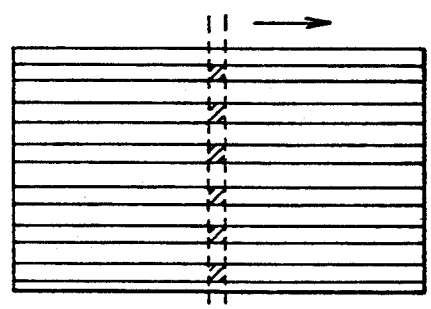
FIG. 5 is a plan view of thin film semiconductor element in which the silicon layer is formed in stripes on the insulating substrate.
Figure 6:
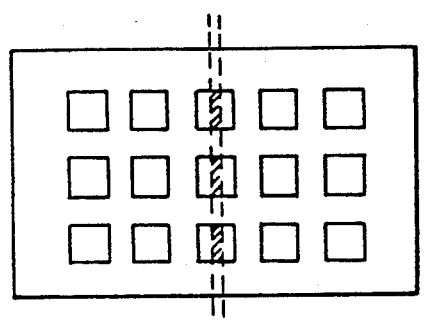
FIG. 6 is a plan view of thin film semiconductor element in which the silicon layer is formed in islands on the insulating substrate.
Figure 7:
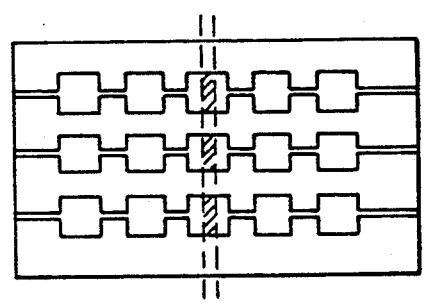
FIG. 7 is a plan view of thin film semiconductor element in which the silicon layer is formed in connected islands on the insulating substrate.
Figure 8:
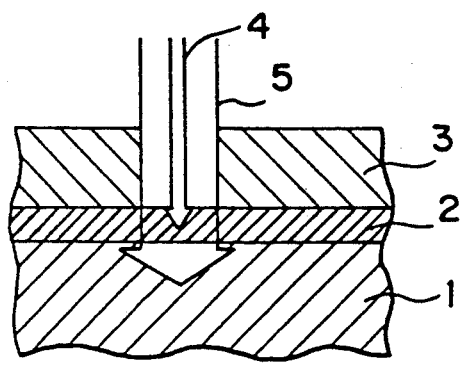
FIG. 8 is a sectional view of thin film semiconductor to show a state of zone melting recrystallization according to the present invention.
Figure 13:
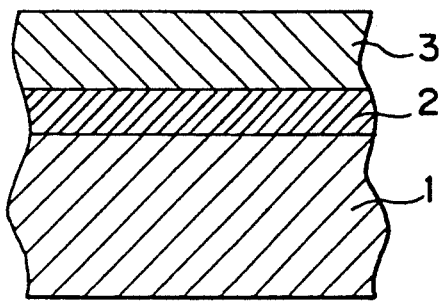
FIG. 13 is a sectional view of thin film semiconductor element according to the present invention.

The support substrate 1 was made of transparent silica glass with thickness of 1.0 mm as shown in FIG. 13. The glass support substrate 1 was washed in the ordinary method. A polycrystalline silicon thin film layer was formed on the substrate 1 as the silicon layer 2, which was to be recrystallized into single crystal by the zone melting recrystallization method, by the low pressure chemical vapor deposition system (LPCVD system). The film thickness of polycrystalline silicon layer was 3500 Å. The polycrystalline silicon thin film 2 was etched in the photolithography to obtain stripes with a width of 100 $\mu$m and at a pitch of 100 $\mu$m as shown in FIG. 5. $SiO_2$ thin film 3 was formed as the surface protection layer with a thickness of 1.2 $\mu$m over the polycrystalline silicon of stripe by the LPCVD system.

The thus-formed polycrystalline silicon thin film sample was simultaneously irradiated by the Ar laser beam or first laser beam and the carbon dioxide gas laser beam or second laser beam to heat and melt for zone melting recrystallization into a single crystal.

The first and the second laser beams were arranged as follows.

Figure 14:
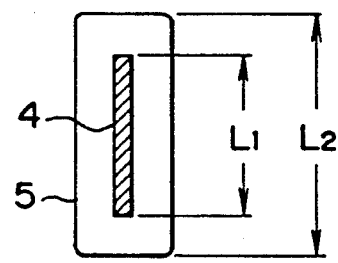
FIG. 14 is a drawing to show a preferable relative position of first and second laser beams enabling two wavelength laser zone melting recrystallization used for thin film semiconductor element according to the present invention.
Figure 15:
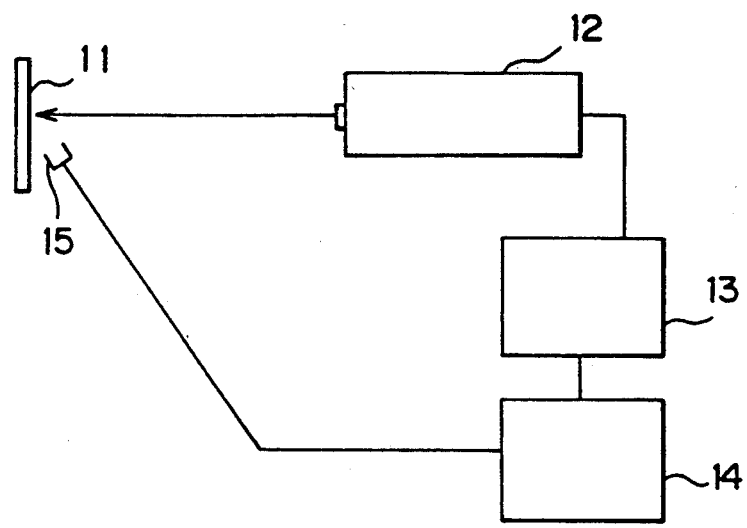
FIG. 15 is a diagram to show an example of feedback control of intensity of laser beam.
Figure 16:
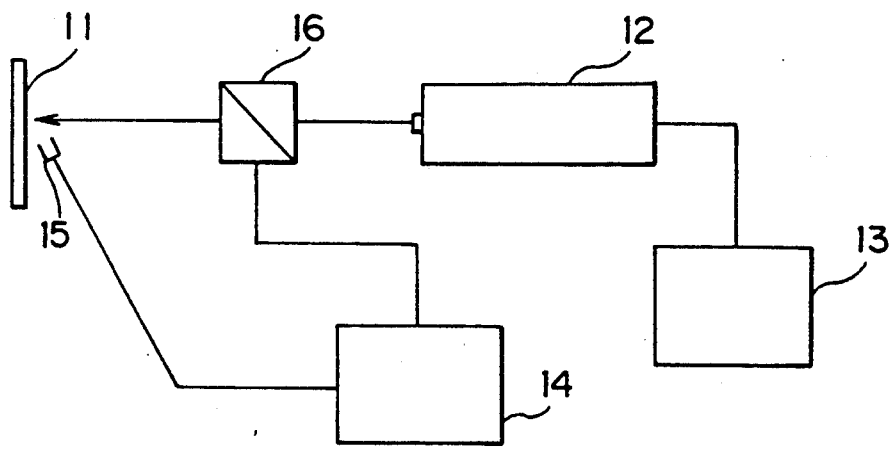
FIG. 16 is a diagram to show another example of feedback control of intensity of laser beam.
Figure 18:
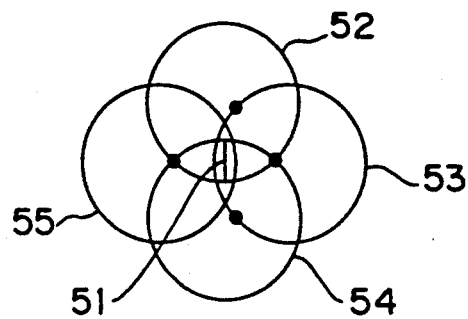
FIG. 18 is a drawing to show an irradiation example of combination of first and second laser beams.

The Ar laser beam 51 was vibrated perpendicular to the polycrystalline silicon stripes by the mirror 28. The vibration frequency of mirror was set to 1 kHz. The vibration amplitude of mirror was set to obtain a beam amplitude of 1 mm of Ar laser beam 51 on the silicon layer. The four carbon dioxide gas laser beams 52, 53, 54, 55 emitted from the four carbon dioxide gas laser oscillators 35, 36, 37, 38 were positioned at a spacing of 3 mm to enclose the irradiation position of linear Ar laser beam 51. FIG. 18 shows a specific example satisfying the relation of FIG. 14.

Figure 9:
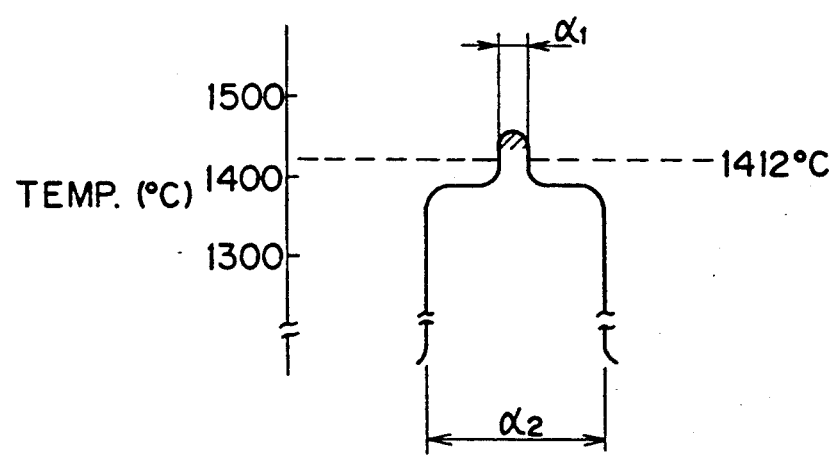
FIG. 9 is a drawing to show a temperature profile of heated region by two laser beams according to the present invention.
Figure 10:
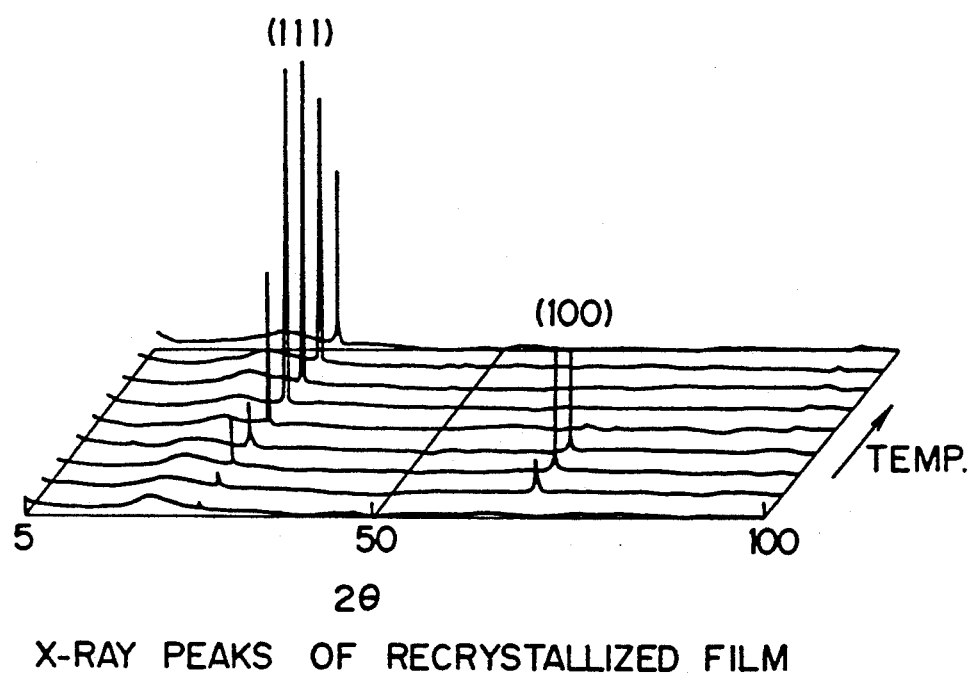
FIG. 10 is X-ray peaks of recrystallized film according to the present invention.
Figure 11A:
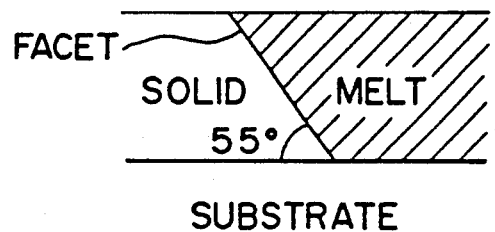
FIG. 11a is a drawing to show an angle of facet of (100) crystal orientation plane.
Figure 11B:
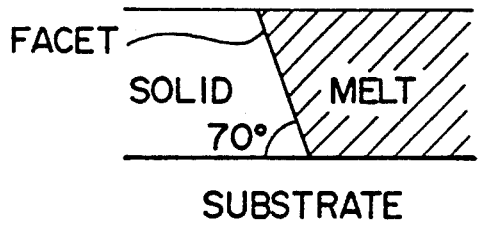
FIG. 11b is a drawing to show an angle of facet of (111) crystal orientation plane.

The output of Ar laser beam 51 was set constant at 2.0 W. As the outputs of four carbon dioxide gas laser beams 52, 53, 54, 55 were increased while vibrating the laser beam 51, the silicon layer was melted at the position irradiated by the vibrating Ar laser beam 51. The temperature profile was obtained on the substrate 1 in this condition for the zone melting recrystallization as shown in FIG. 9. Then the sample 21 was moved by a sample moving mechanism with a stage 25 such that the linear Ar laser beam was perpendicular to the polycrystalline silicon stripes 9. The melted region 8 of silicon at the irradiation position by the Ar laser beam 51 grew to extend down in the scan direction with the relative scan of laser beam on the sample 21. The melt silicon was cooled to be solidified and recrystallized discharging the heat to the surroundings thermally sectioned by the four carbon dioxide gas laser beams 52, 53, 54, 55 to provide single crystal stripes of width of 100 $\mu$m. The extension of silicon melt down in the scan direction depended on a moving speed of sample, the outputs of carbon dioxide gas laser beams, and others. The down extension of melt silicon was about 1 mm when the moving speed of sample 21 was 1 mm/s and the outputs of four carbon dioxide gas laser beams 52, 53, 54, 55 were 30 W, respectively.

Figure 19:
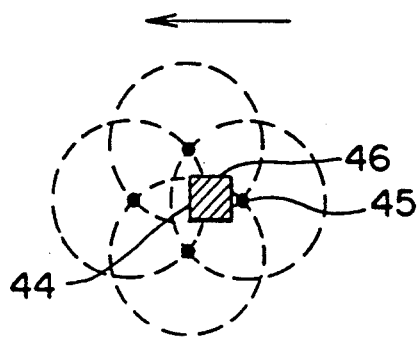
FIG. 19 is a drawing to schematically show a manner of zone melting recrystallization with an arrangement of laser beams according to the present invention.
Figure 20:
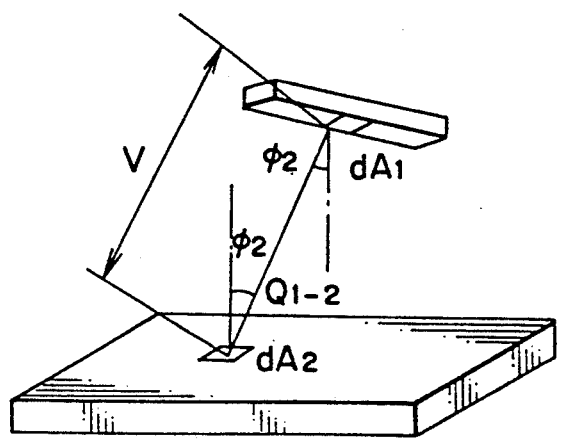
FIG. 20 is a schematic drawing of zone melting method using a line heater.

A temperature of silicon melt was detected by the temperature detection unit 29 at the irradiation position of Ar laser beam 51, which was a temperature measuring portion A as shown by 44 in FIG. 19. The output of Ar laser beam 51 was controlled to maintain the temperature constant by the aforementioned control method. In addition, another temperature was detected by the temperature detection unit 30 at a position distant by 500 $\mu$m down from the solidifying portion of silicon melt extended down in the scan direction with the scanning of sample 21, which was another temperature measuring portion B as shown by 45 in FIG. 19. The outputs of four carbon dioxide gas laser beams 52, 53, 54, 55 were controlled to maintain the temperature constant by the aforementioned control method similarly.

As controlling the temperatures at the temperature measuring portions A, B to be constant, a stable recrystallized film was obtained over the scanned area on the substrate. When the temperatures at the temperature measuring portions A, B were set as shown in Table, the single crystal silicon included the (100) plane orientation and the (111) plane orientation after the scanning of laser beam on the substrate. The single crystal silicon with the two orientations was obtained on the substrate 1 under control by repeating the above operations in the two wavelength laser zone melting recrystallization. Then the $SiO_2$ thin film 3 of surface protection layer was removed by etching with a hydrofluoric acid buffer solution.

A thin film semiconductor element was obtained by the above steps according to the present invention

TABLE

|  | Orientation of recrystallized silicon film | |
|---|---|---|
|  | (100) plane orientation | (111) plane orientation |
| Temperature range of temperature measuring portion A | 1423~1427 | 1432~1438 |
| Temperature range of temperature measuring portion B | 1345~1350 | 1325~1330 |

EXAMPLE 2

The following is an application example using the thin film semiconductor element of Example 1.

Using the processes according to the present invention, a recrystallized film was formed on a transparent silica glass substrate with the (111) plane orientation and the (100) plane orientation adjacent to each other. A series of PIN photodiodes with an area of light intake portion (pixel area) of 100 μm × 100 μm were formed at a pitch of 125 μm on the recrystallized film with the (111) plane orientation. Switches of MOS field-effect transistor (MOSFET) were formed on the recrystallized film with the (100) plane orientation to take out signals corresponding to the respective PIN photodiodes. The switches convert optical signals of the PIN photodiodes into time-sequential electric signals by consecutive switchings with external clock signals. Thus a line optical sensor array with density of 8 sensors/mm using the thin film semiconductor element of the present invention.

EXAMPLE 3

TFT with single crystal region and polycrystalline region

Example 3 is below explained with reference to FIG. 17.

In Example 1, an Ar laser beam was used as the first laser beam, and a carbon dioxide laser beam as the second laser beam.

As shown in FIG. 17, an Ar laser beam 51 was emitted from an Ar laser oscillator 22 with multiline oscillation of beam diameter of 1.9 mm. A convex lens 26 was located to focus a line beam on a sample 21. A mirror 28 with a vibration mechanism 27 was provided between the convex lens 26 and the sample 21. A beam spot was vibrated in a direction perpendicular to a scan direction of laser beam on the sample 21 to form a line temperature profile on the sample 21.

Carbon dioxide lasers 52, 53, 54, 55 were guided from carbon dioxide laser oscillators 35, 36, 37, 38 through respective mirrors 31, 32, 33, 34 onto the sample 21. A beam diameter of the carbon dioxide laser beams was 5 mm.

A laser power source 23 was controlled by a temperature detection unit 29 comprising a radiation thermometer and a feedback control unit 24. The Ar laser beam 51 was controlled by controlling an output of laser power source 23 to maintain the temperature at the metering portion constant through the beam scan. Also, the carbon dioxide gas laser beams 52, 53, 54, 55 were controlled by controlling respective laser power sources 39, 40, 41, 42 through a temperature detection unit 30 comprising a radiation thermometer, and through a feedback control unit 43.

The substrate for recrystallized film was prepared as follows.

The support substrate 1 was made of transparent silica glass with thickness of 1.0 mm as shown in FIG. 13. The glass support substrate 1 was washed in the ordinary method. A polycrystalline silicon thin film layer was formed on the substrate 1 as the silicon layer 2, which was to be recrystallized into single crystal by the zone melting recrystallization method, by the low pressure chemical vapor deposition system (LPCVD system). The film thickness of polycrystalline silicon layer was 4000 Å. $SiO_2$ thin film 3 was formed with a thickness of 2.0 μm on a polycrystalline silicon as the surface protection layer 3 upon the zone melting recrystallization by the LPCVD system.

The thus-formed polycrystalline silicon thin film sample was simultaneously irradiated by the Ar laser beam or first laser beam and the carbon dioxide gas laser beam or second laser beam to heat and melt for zone melting recrystallization into a single crystal. The region to be polycrystallized was excluded from the irradiation of Ar laser beam and carbon dioxide gas laser beam. Then the regions of single crystal and polycrystalline silicon were selectively formed.

The first and the second laser beams were arranged as follows.

The Ar laser beam 51 was vibrated perpendicular to the scan direction by the mirror 28. The vibration frequency of mirror was set to 1 kHz. The vibration amplitude of mirror was set to obtain a beam amplitude of 1 mm of Ar laser beam 51 on the silicon layer. The four carbon dioxide gas laser beams 52, 53, 54, 55 emitted from the four carbon dioxide gas laser oscillators 35, 36, 37, 38 were positioned at a spacing of 3 mm to enclose the irradiation position of linear Ar laser beam 51.

The output of Ar laser beam 51 was set constant at 2.0 W. As the outputs of four carbon dioxide gas laser beams 52, 53, 54, 55 were increased while vibrating the laser beam 51, the silicon layer was melted at the position irradiated by the vibrating Ar laser beam 51. The temperature profile was obtained on the substrate 1 in this condition for the zone melting recrystallization as shown in FIG. 9. Then the sample 21 was moved by a sample moving mechanism with a stage 25. The melted region 8 of silicon at the irradiation position by the Ar laser beam 51 grew to extend down in the scan direction with the relative scan of laser beam on the sample 21. The melt silicon was cooled to be solidified and recrystallized discharging the heat to the surroundings thermally sectioned by the four carbon dioxide gas laser beams 52, 53, 54, 55 to provide a single crystal. The extension of silicon melt down in the scan direction depended on a moving speed of sample, the outputs of carbon dioxide gas laser beams, and others. The down extension of melt silicon was about 1 mm when the moving speed of sample 21 was 1 mm/s and the outputs of four carbon dioxide gas laser beams 52, 53, 54, 55 were 30 W, respectively.

A temperature of silicon melt was detected by the temperature detection unit 29 at the irradiation position of Ar laser beam 51, which was a temperature measuring portion A as shown by 44 in FIG. 19. The output of Ar laser beam 51 was controlled to maintain the temperature constant by the aforementioned control method. In addition, another temperature was detected by the temperature detection unit 30 at a position distant by 500 Jm down from the solidifying portion of silicon melt extended down in the scan direction with the scanning of sample 21, which was another temperature measuring portion B as shown by 45 in FIG. 19. The outputs of four carbon dioxide gas laser beams 52, 53, 54, 55 were controlled to maintain the temperature constant by the aforementioned control method similarly.

As controlling the temperatures at the temperature measuring portions A, B to be constant, a stable recrystallized film was obtained over the scanned area on the substrate. When the temperatures at the temperature measuring portions A, B were set as shown in Table, the single crystal silicon included the (100) plane orientation and the (111) plane orientation after the scanning of laser beam on the substrate. The region to be polycrystallized was excluded from the irradiation of Ar laser 51 and $CO_2$ lasers 52, 53, 54, 55 by the four $CO_2$ laser oscillators.

The single crystal silicon having the controlled orientation planes of (100) plane and (111) plane, and the polycrystalline silicon were formed on the substrate 1 while repeating the above operations and controlling the orientation in the two wavelength laser zone melting recrystallization. FIG. 19 schematically shows the extension of silicon melt after the irradiation of first laser beam when the thin film semiconductor element of the present invention was formed by the arrangement of laser beams as shown in FIG. 18.

Then the $SiO_2$ thin film 3 of surface protection layer was removed by etching with a hydrofluoric acid buffer solution.

A thin film semiconductor element was obtained by the above steps according to the present invention.

Example 4

TFT with single crystal region and polycrystalline region

Figure 21A:
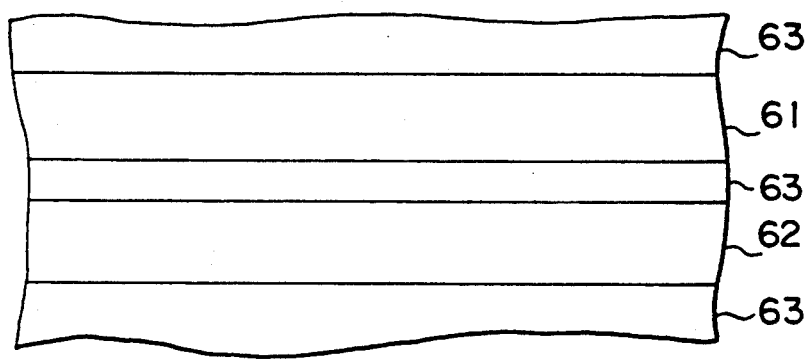
FIG. 21a is a plan view of thin film semiconductor element used in Example 4.
Figure 21B:
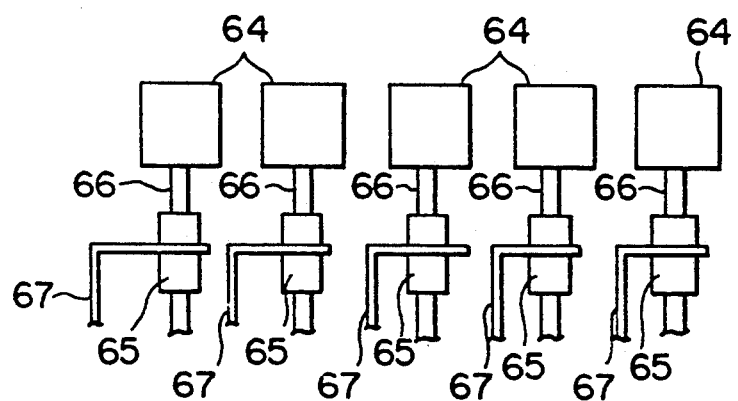

Example 4 is explained with reference to FIG. 21. Example 4 is an application example using the thin film semiconductor element of Example 3.

Using the method according to the present invention, there were formed a recrystallized film 61 with the (111) plane orientation, a recrystallized film 62 with the (100) plane orientation, and a polycrystalline silicon 63 therebetween on a transparent silica glass substrate.

A series of PIN photodiodes 64 with area of light intake portion (pixel area) of 100 $\mu$m×n 100 $\mu$m were formed at a pitch of 125 $\mu$m on the recrystallized film 61 with the (111) plane orientation using the ordinary semiconductor process. Switches 65 of MOS FET were formed on the recrystallized film 62 with the (100) plane orientation to take out signals corresponding to the respective PIN photodiodes. Wiring 66 was formed using the polycrystalline silicon to electrically connect the MOS FET switches 65 to PIN photodiodes 64. The polycrystalline silicon was subject to sufficient diffusion in an impurity diffusion process of semiconductor processing. The polycrystalline silicon 67 of gate electrode of MOS transistor was simultaneously diffused in the diffusion process. The switches of MOS FET carries out serial switchings by external clock signals to convert the optical signals of PIN photodiodes into time-sequential electric signals. Thus a line optical sensor array with density of 8 sensors/mm was completed decreasing metal wiring with use of thin film semiconductor element of present invention.

Example 5

Example 5 is below explained with reference to FIG. 17. In Example 1, an Ar laser beam was used as the first laser beam, and a carbon dioxide laser beam as the second laser beam.

As shown in FIG. 17, an Ar laser beam 51 was emitted from an Ar laser oscillator 22 with multiline oscillation of beam diameter of 1.9 mm. A convex lens 26 was located to focus a line beam on a sample 21. A mirror 28 with a vibration mechanism 27 was provided between the convex lens 26 and the sample 21. A beam spot was vibrated in a direction perpendicular to a scan direction of laser beam on the sample 21 to form a line temperature profile on the sample 21.

Carbon dioxide lasers 52, 53, 54, 55 were guided from carbon dioxide laser oscillators 35, 36, 37, 38 through respective mirrors 31, 32, 33, 34 onto the sample 21. A beam diameter of the carbon dioxide laser beams was 5 mm.

A laser power source 23 was controlled by a temperature detection unit 29 comprising a radiation thermometer and a feedback control unit 24. The Ar laser beam 51 was controlled by controlling an output of laser power source 23 to maintain the temperature at the metering portion constant through the beam scan. Also, the carbon dioxide gas laser beams 52, 53, 54, 55 were controlled by controlling respective laser power sources 39, 40, 41, 42 through a temperature detection unit 30 comprising a radiation thermometer, and through a feedback control unit 43.

The substrate for recrystallized film was prepared as follows.

The support substrate 1 was made of transparent silica glass with thickness of 1.6 mm as shown in FIG. 13. The glass support substrate 1 was washed in the ordinary method. An amorphous silicon thin film was formed on the substrate 1 as the silicon layer 2, which was to be recrystallized into single crystal by the zone melting recrystallization method, using a sputtering apparatus. The film thickness of polycrystalline silicon layer was 3500 Å. Hydrogen content was 0.8 atom % by IR spectrum analysis. Then $SiO_2$ thin film was formed with thickness of 1.5 $\mu$m as the surface protection layer 3 upon the zone melting recrystallization on the amorphous silicon layer by the LPCVD system.

The thus-formed polycrystalline silicon thin film sample was simultaneously irradiated by the Ar laser beam or first laser beam and the carbon dioxide gas laser beam or second laser beam to heat and melt for zone melting recrystallization into a single crystal.

The first and the second laser beams were arranged as follows.

The Ar laser beam 51 was vibrated perpendicular to the sample moving direction by the mirror 28. The vibration frequency of mirror was set to 1 kHz. The vibration amplitude of mirror was set to obtain a beam amplitude of 1 mm of Ar laser beam 51 on the silicon layer. The four carbon dioxide gas laser beams 52, 53, 54, 55 emitted from the four carbon dioxide gas laser oscillators 35, 36, 37, 38 were positioned at a spacing of 3 mm to enclose the irradiation position of linear Ar laser beam 51. FIG. 18 shows a specific example satisfying the relation of FIG. 14.

The output of Ar laser beam 51 was set constant at 2.0 W. As the outputs of four carbon dioxide gas laser beams 52, 53, 54, 55 were increased while vibrating the laser beam 51, the silicon layer was melted at the position irradiated by the vibrating Ar laser beam 51. The temperature profile was obtained on the substrate 1 in this condition for the zone melting recrystallization as shown in FIG. 9. Then the sample 21 was moved by a sample moving mechanism with a stage 25 with respect to the line Ar laser beam. The melted region 8 of silicon at the irradiation position by the Ar laser beam 51 grew to extend down in the scan direction with the relative scan of laser beam on the sample 21. The melt silicon was cooled to be solidified and recrystallized discharging the heat to the surroundings thermally sectioned by the four carbon dioxide gas laser beams 52, 53, 54, 55 to provide a single crystal silicon region of stripe of width of 500 μm. The extension of silicon melt down in the scan direction depended on a moving speed of sample, the outputs of carbon dioxide gas laser beams, and others. The down extension of melt silicon was about 1 mm when the moving speed of sample 21 was 1 mm/s and the outputs of four carbon dioxide gas laser beams 52, 53, 54, 55 were 30 W, respectively.

A temperature of silicon melt was detected by the temperature detection unit 29 at the irradiation position of Ar laser beam 51, which was a temperature measuring portion A as shown by 44 in FIG. 19. The output of Ar laser beam 51 was controlled to maintain the temperature constant by the aforementioned control method. In addition, another temperature was detected by the temperature detection unit 30 at a position distant by 500 μm down from the solidifying portion of silicon melt extended down in the scan direction with the scanning of sample 21, which was another temperature measuring portion B as shown by 45 in FIG. 19. The outputs of four carbon dioxide gas laser beams 52, 53, 54, 55 were controlled to maintain the temperature constant by the aforementioned control method similarly.

Figure 12:
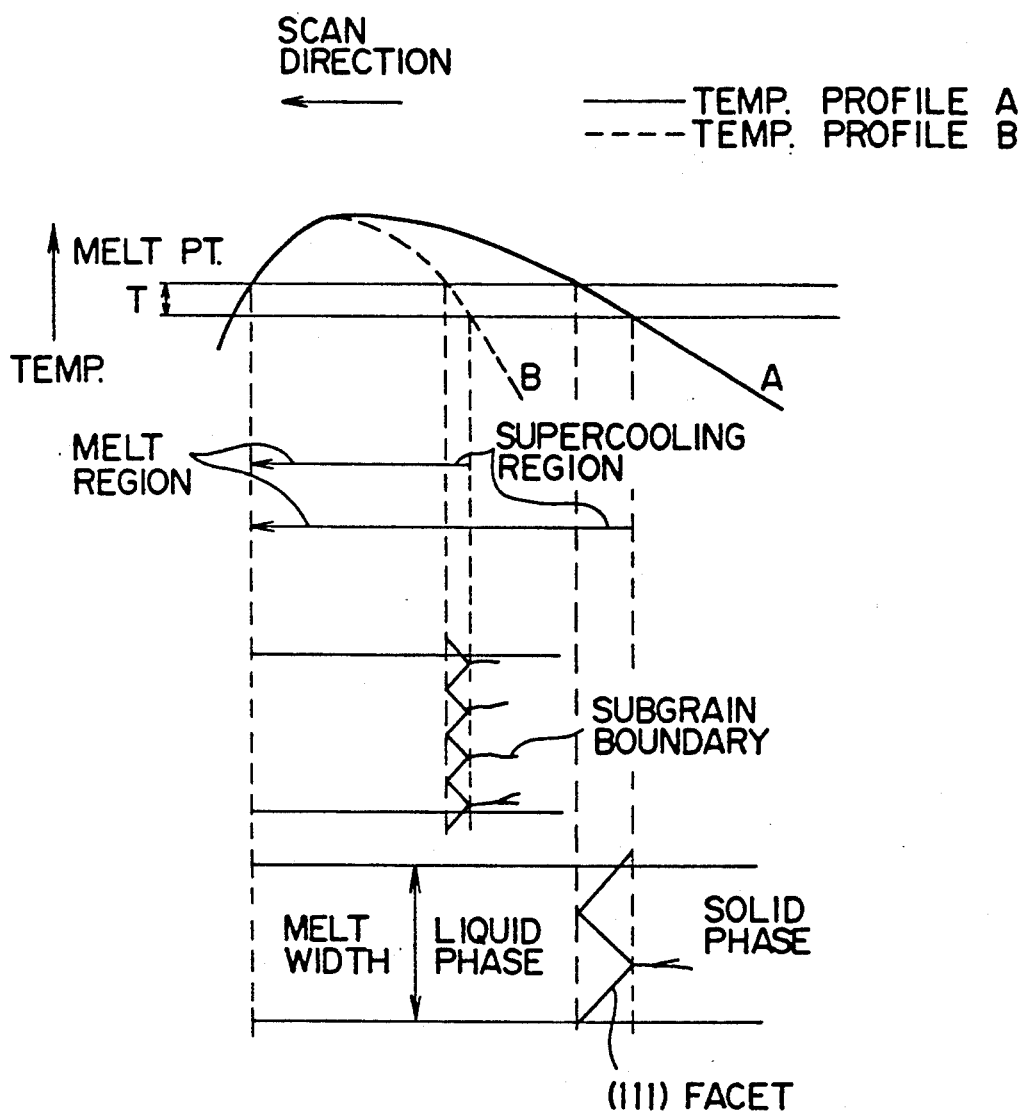
FIG. 12 is a drawing to schematically show temperature profiles and subgrain boundary upon melting recrystallization of silicon layer.

As controlling the temperatures at the temperature measuring portions A, B to be constant, a stable recrystallized film was obtained over the scanned area on the substrate. When a temperature range of temperature measuring portion A was set between 1420° C. and 1430° C. and a temperature range of temperature measuring portion B between 1330° C. and 1340° C., the single crystal silicon region was formed with an extremely small amount of subgrain boundary as shown in FIG. 12. Then the $SiO_2$ thin film 3 of surface protection layer was removed by etching with a hydrofluoric acid buffer solution.

A thin film semiconductor element was obtained by the above steps according to the present invention.

EXAMPLE 6

Example 6 is an application example using the thin film semiconductor element of Example 5. Using the method according to the present invention, an amorphous silicon thin film and a single crystal silicon thin film were formed in the same plane on a transparent silica glass substrate. The plasma hydrogenation was effected on the amorphous silicon thin film. A series of a-Si: H photodiodes with area of light intake portion (pixel area) of 100 μm × 100 μm were formed at a pitch of 125 μm on the amorphous silicon thin film. Switches of MOS field-effect transistor (MOSFET) were formed on the single crystal thin film to take out signals corresponding to the respective PIN photodiodes. The switches convert optical signals of the PIN photodiodes into time-sequential electric signals by consecutive switchings with external clock signals. Thus a line optical sensor array with density of 8 sensors/mm using the thin film semiconductor element of the present invention.

COMPARATIVE EXAMPLE 7

An amorphous silicon layer was formed on a transparent silica glass substrate by the LP-CVD method similarly as in Example 5. The film thickness of amorphous silicon layer was 3400 Å. The hydrogen content was 5 atom % by IR spectrum analysis. $SiO_2$ thin film was formed with a thickness of 1.5 μm on the amorphous silicon layer by the LP-CVD method. The thus-formed amorphous silicon thin film substrate was recrystallized by the zone melting recrystallization in the similar manner to Example 5. There were numerous voids appeared in the recrystallized film, and no substrate was usable for devices.

As described above, the present invention provides the thin film semiconductor element of new type which is composed of different crystal orientation planes on specified areas of single semiconductor layer, and/or of different crystal states.

According to the present invention, the crystal orientation plane or the crystallinity may be arbitrarily provided on specified regions on a single substrate to fit a desired purpose or application, broadening the degree of freedom in device designing, in production process, and so on to obtain a high performance device.

Many widely different embodiments of the present invention my be constructed without departing from the spirit and scope of the present invention. It should be understood that the present invention is not limited to the specific embodiments described in the specification, except as defined in the appended claims.

What is claimed is:

1. An apparatus for producing a thin film semiconductor element by heating to recrystallise a composite of insulating substrate and semiconductor layer thereon, comprising:

first heating means for emitting a first laser beam, which the semiconductor layer can absorb, to heat said semiconductor layer;

second heating means for emitting a second laser beam, which the insulating layer can absorb and which the semiconductor layer can transmit, to heat said substrate; and temperature controlling means for controlling said first and second heating means such that a predetermined temperature profile is formed in the composite to fuse and then recrystallise said semiconductor layer so as to obtain a semiconductor single crystal layer therein having a (100) orientation plane or a (111) orientation plane.

2. An apparatus according to claim 1, further comprising scanning means for performing relative scan of the composite and the first, second heating means.

3. An apparatus according to claim 1, wherein said first laser beam is enclosed in said second laser beam.

4. An apparatus according to claim 1, wherein said temperature controlling means measures a temperature at a portion irradiated by the first laser beam to carry out feed-back control of output of first laser beam.

5. An apparatus according to claim 1, wherein said temperature controlling means measures a temperature at a portion irradiated by the second laser beam to carry out feed-back control of output of second laser beam.

6. An apparatus for zone melting a thin semiconductor film disposed on an insulating substrate of a composite, comprising:
   means for holding said composite;
   first laser means for generating a first laser beam which is absorbed by the semiconductor film to thereby heat the thin semiconductor film;
   first optical means, disposed between said first laser means and said holding means, for focusing said first laser beam on the thin semiconductor film;
   a first deflection device for deflecting the first laser beam emitted from said first optical means toward the thin semiconductor film;
   oscillation means, connected to said first deflection device, for oscillating said focused first laser beam at a predetermined frequency in a direction substantially perpendicular to the direction of movement of a melting zone of the thin semiconductor film to thereby form a linear thermal profile on the thin semiconductor film;
   a plurality of second lasers, each of which generates a second laser beam absorbed by the insulating substrate to thereby heat the insulating substrate;
   a plurality of second deflection devices, each of which respectively deflects the second laser beam generated by a corresponding second laser in such a manner that each of the second laser beams is deflected to different positions on the insulating substrate to thereby form a spread thermal profile which includes and said linear thermal profile and extends beyond said linear thermal profile;
   a first temperature detecting device for detecting a first temperature of a melted portion of the thin semiconductor film;
   a second temperature detecting device for detecting a second temperature of a portion of the thin semiconductor film, said portion being situated at a position separated by a predetermined distance in a scanning direction from a solidifying portion of the thin semiconductor film;
   a first controller, electrically connected to said first temperature detecting device and said first laser means, for controlling an output of said first laser means so that said first temperature is maintained within a first predetermined temperature range higher than the melting point of the thin semiconductor film;
   a plurality of second controllers, each electrically connected to the second temperature detecting device and a corresponding second laser, for controlling an output of each of said second lasers so that said second temperature is maintained within a second predetermined temperature range lower than the melting point of the thin semiconductor film; and
   means for relatively moving said holding means and said first and second laser beams in a predetermined direction.

7. An apparatus for zone melting a thin semiconductor film according to claim 6, in which said first laser means comprises an argon laser.

8. An apparatus for zone melting a thin semiconductor film according to claim 6, in which each of said plurality of second lasers comprises a CO2 laser.

9. An apparatus for zone melting a thin semiconductor film according to claim 6, in which said first optical means comprises a convex lens and said first deflection device comprises a mirror.

10. An apparatus for zone melting a thin semiconductor film according to claim 6, in which each of said second deflection devices comprises a mirror.

11. An apparatus for zone melting a thin semiconductor film according to claim 6, in which each of said first and second temperature detecting devices comprises a radiation thermometer.

12. An apparatus for zone melting a thin semiconductor film according to claim 6, wherein the thin semiconductor film is composed of polycrystalline silicon.

13. An apparatus for zone melting a thin semiconductor film according to claim 6, in which said predetermined distance is 500 $\mu$m.

14. An apparatus for zone melting a thin semiconductor film according to claim 8, in which said CO2 laser is so constructed as to emit a CO2 laser beam having a diameter of 5 mm.

15. An apparatus for zone melting a thin semiconductor film according to claim 8, which said plurality of second laser means comprise at least four $CO_2$ lasers.

16. An apparatus for zone melting a thin semiconductor film according to claim 12, in which in the case where said first temperature is maintained in a range of 1423° C. to 1427° C., a single srystal silicon with a (100) orientation plane is recrystallized in the thin semiconductor film.

17. An apparatus for Zone melting a thin semiconductor film according to claim 12, in which in the case where said first temperature is maintained in a range of 1432° C. to 1438° C. and said second temperature is maintained in a range of 1325° C. to 1330° C., a single crystal silicon with a (111) orientation plane is recrystallized in the thin semiconductor film.

* * * * *

UNITED STATES PATENT AND TRADEMARK OFFICE
CERTIFICATE OF CORRECTION

PATENT NO. : 5,304,357
DATED : April 19, 1994
INVENTOR(S) : Yukito SATO, Mitsugu IRINODA, Kouichi OHTAKA, Takeshi HINO, and Masafumi KUMANO It is certified that error appears in the above-identified patent and that said Letters Patent is hereby corrected as shown below:

Title page, left-hand column, section [73], change "Ricoh Co., Ltd., Tokyo, Japan" to --Ricoh Company, Ltd., Tokyo, Japan, and Ricoh Research Institute of General Electronics Co., Ltd., Natori, Japan--

Signed and Sealed this

Fifth Day of August, 1997

Attest:

Attesting Officer

BRUCE LEHMAN

Commissioner of Patents and Trademarks